United States Patent [19]
Tarzwell

[11] Patent Number: 5,982,187
[45] Date of Patent: Nov. 9, 1999

[54] RESILIENT CONNECTOR HAVING A TUBULAR SPRING

[75] Inventor: Patrick James Tarzwell, Mesa, Ariz.

[73] Assignee: AlphaTest Corporation, Mesa, Ariz.

[21] Appl. No.: 08/084,623

[22] Filed: Jul. 1, 1993

[51] Int. Cl.⁶ .................................................. G01R 1/06
[52] U.S. Cl. .......................................... 324/756; 324/72.5
[58] Field of Search ...................... 324/158 P; 267/180, 267/148, 166, 221; 401/31, 214

[56] References Cited

U.S. PATENT DOCUMENTS

| | | | |
|---|---|---|---|
| 3,179,087 | 4/1965 | Kahn | 267/180 |
| 3,676,776 | 7/1972 | Bauer et al. | 324/72.5 |
| 4,423,373 | 12/1983 | LeCroy | 324/158 P |
| 4,476,433 | 10/1984 | Logan | 324/158 P |
| 4,721,903 | 1/1988 | Harsch | 324/158 P |
| 4,740,746 | 4/1988 | Pollock | 324/158 P |
| 4,773,877 | 9/1988 | Kruger . | |
| 4,801,876 | 1/1989 | Nanzai | 324/158 F |
| 4,814,697 | 3/1989 | Krüger | 324/158 P |
| 4,826,143 | 5/1989 | Latorre | 267/148 |
| 4,837,622 | 6/1989 | Whann et al. | 324/158 P |
| 4,841,240 | 6/1989 | Hsue et al. | 324/158 P |
| 4,885,533 | 12/1989 | Coe | 324/158 P |
| 4,931,726 | 6/1990 | Kasukabe et al. | 324/158 F |
| 4,978,312 | 12/1990 | Fodali | 439/219 |
| 5,004,977 | 4/1991 | Kazama | 324/158 P |
| 5,014,004 | 5/1991 | Kreibich et al. | 324/158 P |
| 5,084,673 | 1/1992 | Kazama | 324/158 P |

*Primary Examiner*—Josie Ballato
*Attorney, Agent, or Firm*—Cahill, Sutton & Thomas P.L.C.

[57] ABSTRACT

A resilient connector uses a spring made from a cylindrical tube. The wall of the tube is cut in a helix along the central portion of the tube to form the spring. One or more plungers within the spring have a tip extending past a first end of the spring and a second end attached to the spring. Each plunger is a pin or a pair of coaxial conductors separated by a dielectric sheath. One of the coaxial conductors is a conductive layer on the sheath. A double ended connector uses a spring made as described above with a pair of plungers attached one each to each end of the spring.

20 Claims, 4 Drawing Sheets

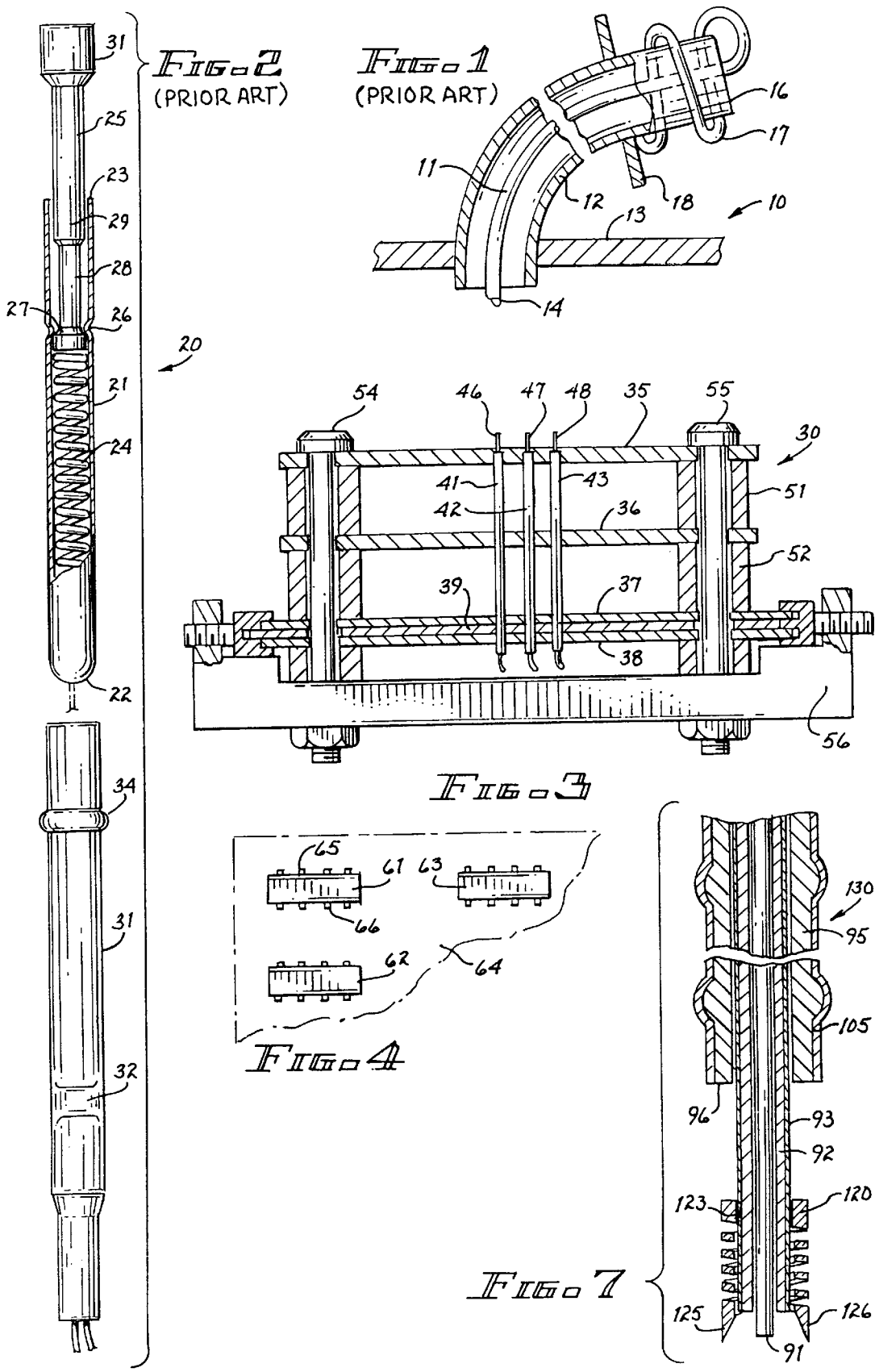

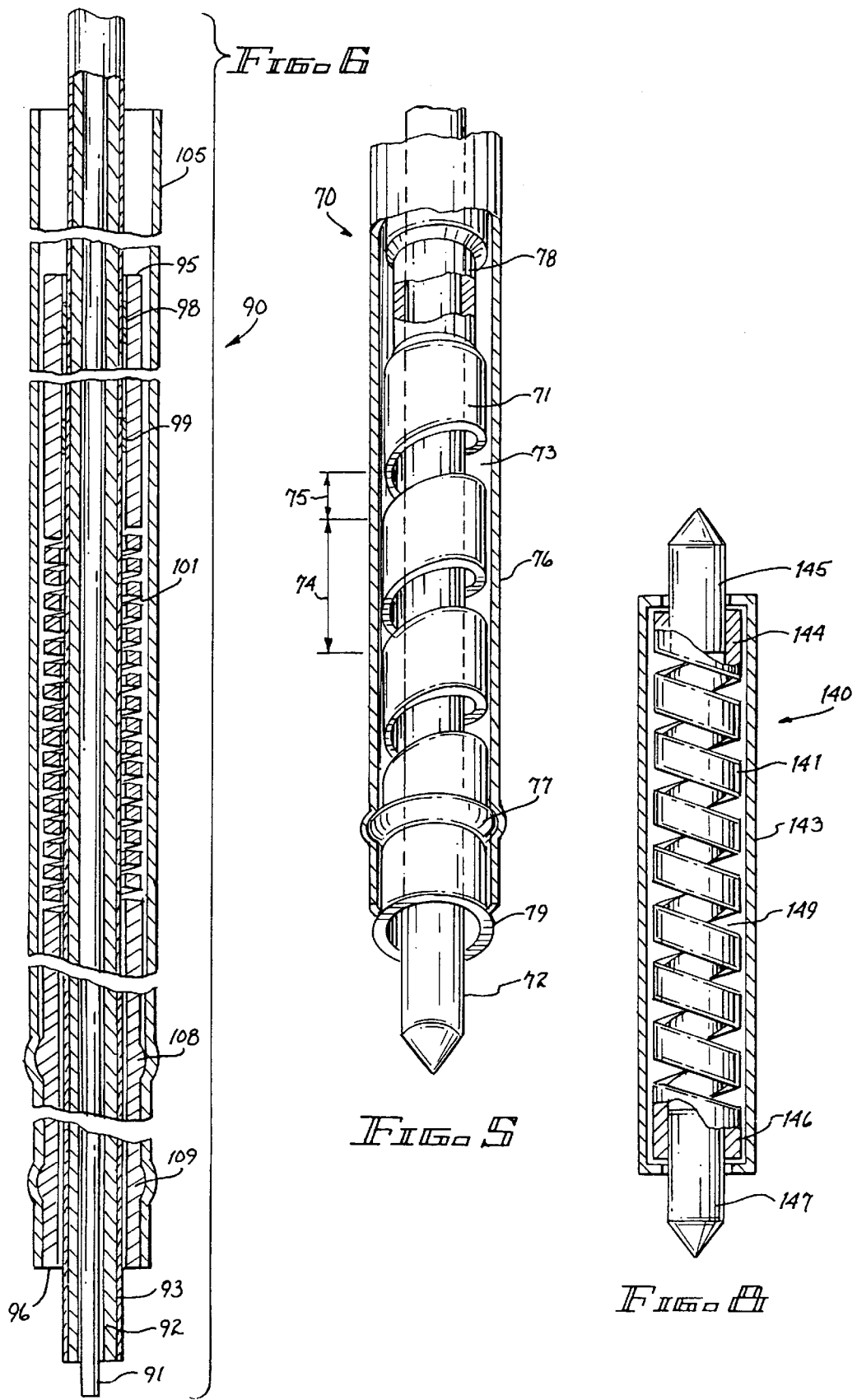

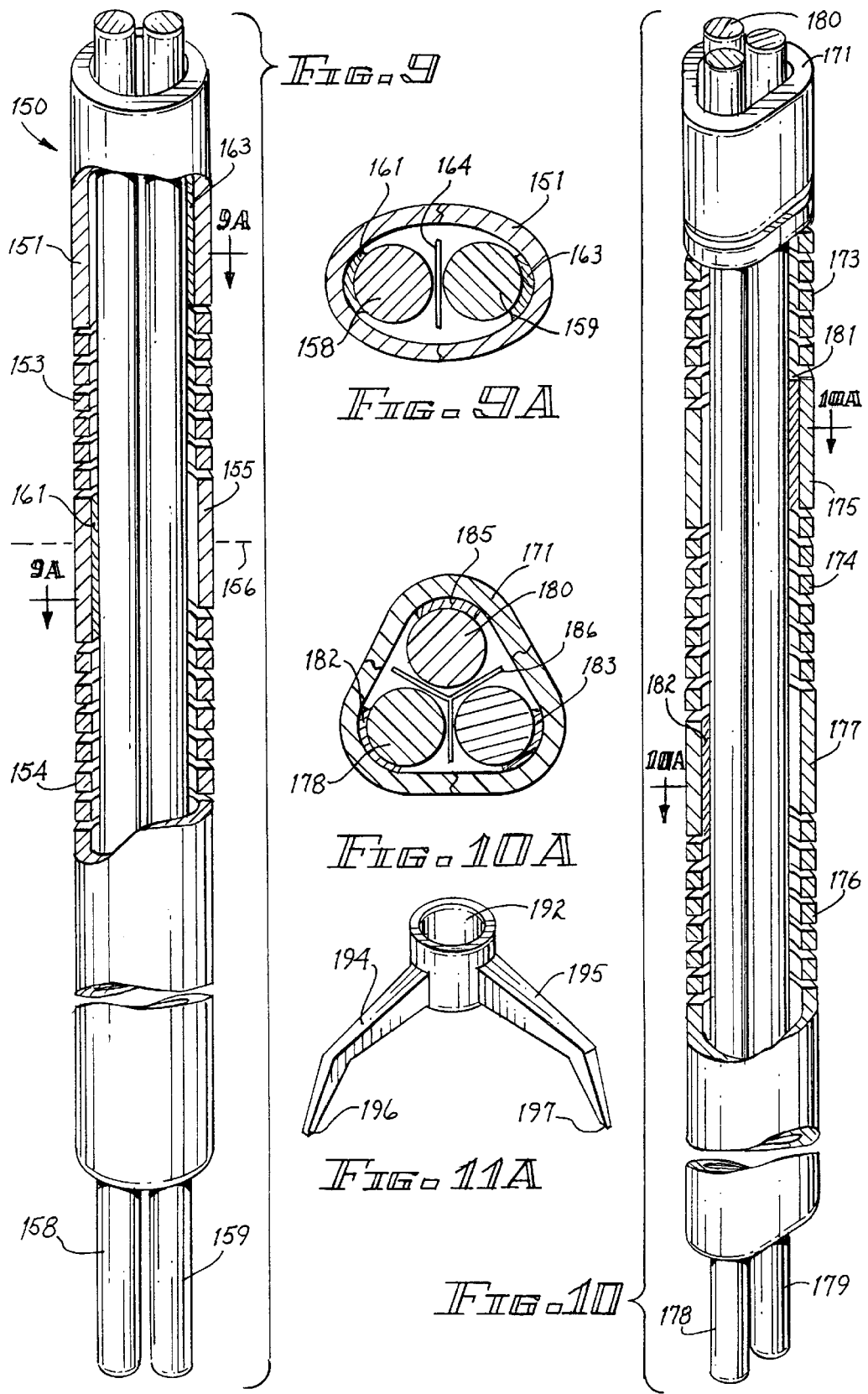

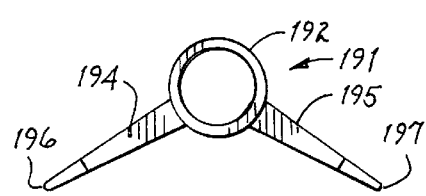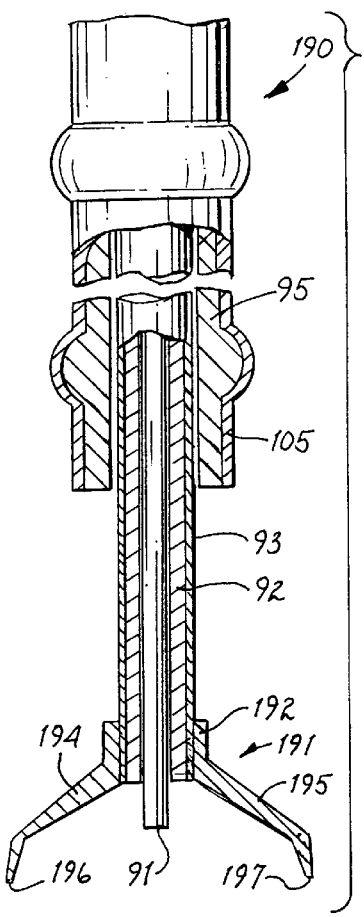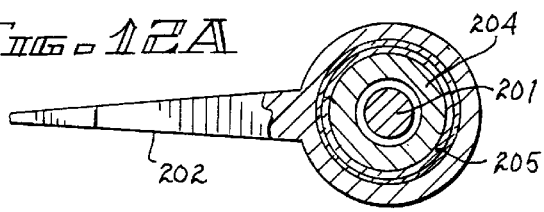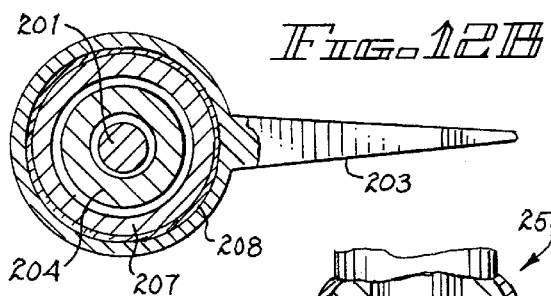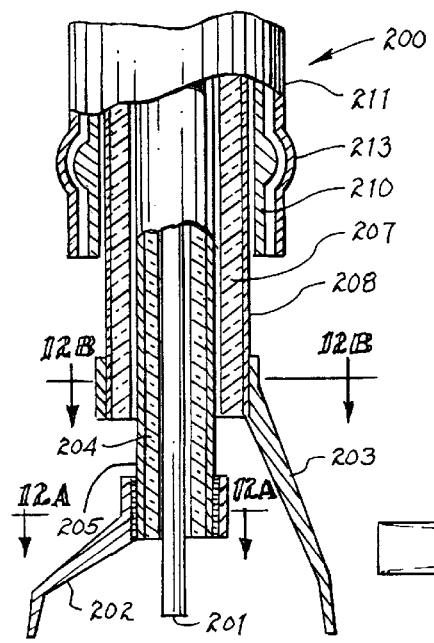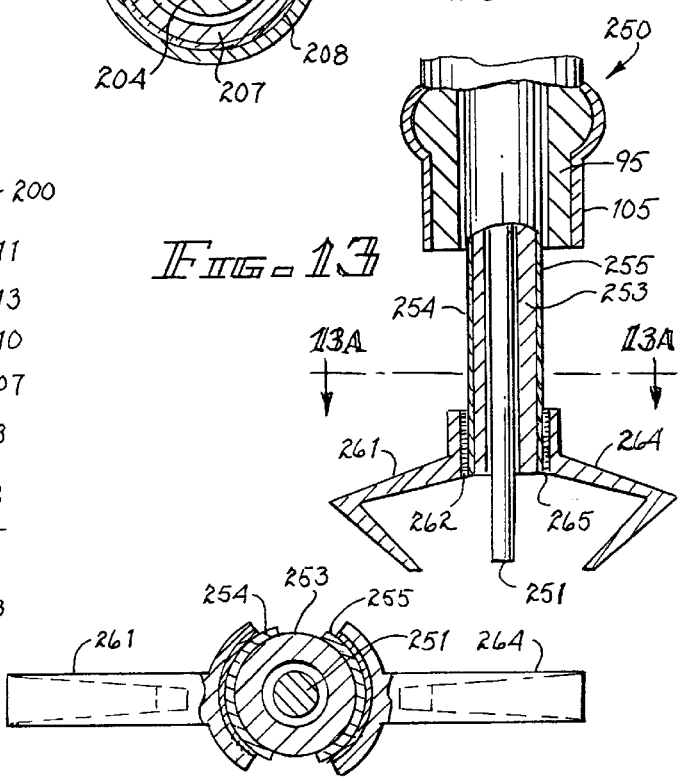

RESILIENT CONNECTOR HAVING A TUBULAR SPRING

BACKGROUND OF THE INVENTION

This invention relates to resilient connectors and, in particular, to a resilient probe including a spring made from a tube having a helical cut along its length.

Resilient probes have been used for many years to make electrical connections to printed circuit boards and hybrid substrates for testing. In the past, electrical contacts on printed circuit boards were relatively widely spaced, e.g. 50–200 mils (1.3–5.0 mm) center to center. Integrated circuits have become much smaller and contact spacing has decreased, making it increasingly difficult to obtain a reliable connection for testing. For example, surface mount devices have a contact spacing of 8–15 mils (0.2–0.4 mm).

Commercially available resilient probes have four or five components, typically including an elongated probe body or barrel having a spring in a closed end and a plunger resting on the spring and extending from an open end of the barrel. A portion of the plunger fits closely within the barrel to provide electrical contact between the plunger and the barrel. The barrel can be mounted directly in a fixture in an array with other probes or can be mounted in a conductive tube or receptacle which is mounted in a fixture in an array with other probes. When the tip of the plunger is pressed onto a contact area, the plunger is pushed into the barrel, compressing the spring against the closed end of the barrel.

Resilient probes of the prior art rely on a wiping contact between the plunger and the barrel. The wiping contact wears after a number of operations and may degrade electrical performance. In addition, the rubbing surfaces are subject to corrosion and particle contamination. The prior art has attempted to overcome this problem by soldering one end of the spring to the plunger and soldering the other end of the spring to the barrel.

A probe in which the spring is not soldered conducts a signal from the tip of the probe through the wiping contact between the plunger and the barrel to a lead attached to the barrel. Soldering the spring may eliminate the problem of intermittent contact but introduces an inductor into the circuit: the helical spring. When a soldered spring is used, the signal is conducted from the tip of the plunger through the spring to the barrel. The inductance of the spring can be significant at very high frequency, especially for circuits generating square waves rather than sinusoidal waves. The inductance can cause degradation of the signal, e.g. distortion of a square wave, phase distortion, or impedance changes.

Resilient probes tend to be electrically long in terms of the wavelength of the signal passing through the probe. For example, a probe 7.5 cm long is one quarter wavelength long at 1000 Mhz. It is preferred to have a probe much less than one tenth of a wavelength long to minimize problems with discontinuities and reflections. The several components in a probe of the prior art can cause discontinuities and reflections to occur. A coaxial probe of the prior art is electrically like a coaxial cable having a number of joints or connections in the cable. Each joint in the cable is a discontinuity and can cause reflections, particularly if adjoining segments of the cable do not have the same impedance. The same is true within a probe.

In addition to close pin spacing and very high frequency signals, modern printed circuit boards often have concentric contact areas. For example, some devices have a lead which is not grounded but is held at ground potential. This "driven ground" is difficult or impossible to access with a probe. Another problem is the separation of voltage and current terminals for resistance measurements. Precise measurement of resistance requires that the current through a device be applied from a first set of terminals and the voltage drop across the device be measured from a separate pair of terminals. Otherwise, one is measuring the voltage drop of the device plus the voltage drops across the two contacts to the device. Since the current and voltage terminals are closely space, probes of the prior art have not been able to separately access these terminals. Thus, there is a need in the art to be able to contact concentric or closely spaced terminals, e.g. signal, driven ground, and electrical ground or current, voltage, and ground terminals.

The restoring force in a typical resilient probe comes from a compressed, helical spring. As industry attempts to miniaturize probes to keep pace with circuit density, there is a problem in that reducing the size of the spring reduces the restoring force provided by the spring. This limits the amount one can miniaturize a resilient probe constructed as known in the prior art.

A helical spring increases in diameter when compressed, requiring that the inside diameter of the barrel be larger than the nominal outside diameter of the spring in order to provide adequate clearance for the spring and to prevent binding. Binding is particularly likely when the plunger is subjected to excessive travel, possibly jamming one coil between another coil and the barrel. The variable diameter of the spring may adversely affect high frequency performance, especially in a coaxial probe.

In many applications, e.g. hard drives for computers and optical disc players, a resilient connection is made to a linearly moving head for reading or writing data. Typically, the resiliency of fine wires is relied upon for a resilient electrical connection between the head and the rest of the circuitry. For many applications, it is desired to obtain a more rugged, but no less resilient, connection. Particularly for data scanning applications, mechanical stability and repeatable motion are of paramount importance.

In view of the foregoing, it is therefore an object of the invention to provide a resilient connector which can easily be miniaturized.

Another object of the invention is to provide a resilient probe suitable for very high frequency signals.

A further object of the invention is to provide a resilient probe which can be arranged with like probes in an array having a center to center spacing of less than 10 mils.

Another object of the invention is to provide a resilient probe having fewer discontinuities than probes of the prior art.

A further object of the invention is to provide a resilient connector having a large over-drive capability.

Another object of the invention is to provide a resilient connector having improved stability and repeatable motion.

A further object of the invention is to provide a multi-plunger, coaxial connector.

SUMMARY OF THE INVENTION

The foregoing objects are achieved in the invention in which a resilient probe uses a spring made from a cylindrical tube. In accordance with a first aspect of the invention, the wall of the tube is cut in a helix along the central portion of the tube to form the spring. Because the spring is not wound on a mandrel, there are no built-in stresses and the spring is dimensionally very stable, particularly if the tube is made from quartz. A quartz spring has no "memory" even after thousands of cycles. The spring is also self-limiting since the coils of the spring have a rectangular cross-section. Compressing the spring may cause the coils to touch, but the coils cannot move past each other or jam as with springs having coils with a round cross-section. Thus, the coils bottom out and the spring is as rigid lengthwise as the tube from which it was made.

In accordance with a second aspect of the invention, a plunger is inserted lengthwise through the tubular spring. The tip of the plunger extends past a first end of the tubular spring and a second end of the tubular spring is attached to the plunger. The tubular spring and the plunger are inserted into a receptacle and the first end of the tubular spring is attached to the receptacle. Electrical connection is made to the receptacle. When the tip of the probe is pressed against a contact, the tubular spring extends or stretches within the receptacle.

In accordance with a third aspect of the invention, a plunger includes coaxial conductors separated by a dielectric sheath between the inner and outer conductors. A spring made from a tube as described above has an inside diameter slightly greater than the outside diameter of the outer conductor. The plunger is inserted through the spring and the tip of the plunger extends past a first end of the spring. A receptacle fits over the spring and has a first end attached to the first end of the spring. A second end of the spring is attached to the outer conductor. Pressure on the tip of the plunger causes the spring to extend. In one embodiment of the invention, the dielectric sheath and the spring are quartz tubes and the outer coaxial conductor is a metal coating on the outer surface of the dielectric sheath. In another embodiment of the invention, a resilient tip made from a second spring is electrically connected to the outer coaxial conductor and terminates in one or more prongs for contacting a ground point on the device under test. In this alternative embodiment, both ends of the outer conductor are grounded, thereby shielding the central coaxial conductor along its entire length. In either of these embodiments, the spring can be metal or an insulator and, if metal, does not contribute any inductance since it is outside the outer coaxial conductor, enabling the probe to carry very high frequency signals without degradation.

In accordance with a fourth aspect of the invention, more than one plunger is included within a tubular spring having separate sections. Each plunger is attached to a different section and is separately biased by the spring. Since more than one plunger is within a spring, the minimum contact spacing which can be probed is determined by the diameters of the plungers, not the diameter of the probe.

In accordance with a fifth aspect of the invention, a double ended connector uses a spring made as described above, but compressed rather than extended during use. A contact pin is attached to each end of the spring and the dimensional stability of the spring maintains the alignment of the contact pins, assuring reliable connection.

In all aspects of the invention, the probe presents no joints to the signal on the plunger, i.e. there is an unbroken path from the circuit board through the plunger.

BRIEF DESCRIPTION OF THE DRAWINGS

A more complete understanding of the invention can be obtained by considering the following detailed description in conjunction with the accompanying drawings, in which:

FIG. 1 illustrates a prior art probe using a conductor for an extensible spring at the proximal end of the probe;

FIG. 2 illustrates a probe and receptacle constructed in accordance with the prior art;

FIG. 3 illustrates a fixture for holding a plurality of probes;

FIG. 4 illustrates a portion of a circuit board to be tested;

FIG. 5 illustrates a probe constructed in accordance with the invention;

FIG. 6 is a cross-sectional view of a coaxial probe constructed in accordance with the invention;

FIG. 7 is a cross-sectional view of a coaxial probe constructed in accordance with an alternative embodiment of the invention;

FIG. 8 is a partial cross-section of a double ended connector constructed in accordance with the invention;

FIG. 9 illustrates a probe constructed in accordance with an alternative embodiment of the invention in which the probe includes two plungers in a single spring;

FIG. 9A is a cross-section along line 9A—9A in FIG. 9.

FIG. 10 illustrates a probe constructed in accordance with an alternative embodiment of the invention in which the probe includes three plungers in a single spring;

FIG. 10A is a cross-section along line 10A—10A in FIG. 9;

FIG. 11 is an alternative embodiment of a probe tip having cantilever arms for ground contact.

FIG. 11A is a perspective view of the probe tip shown in FIG. 11.

FIG. 11B is a bottom view of the probe tip shown in FIG. 11.

FIG. 12 illustrates the distal end of a tri-axial probe constructed in accordance with the invention.

FIG. 12A is a cross-section along line 12A—12A in FIG. 12.

FIG. 12B is a cross-section along line 12B—12B in FIG. 12.

FIG. 13 illustrates an alternative embodiment of a three conductor, coaxial probe constructed in accordance with the invention.

FIG. 13A is a cross-section along line 13A—13A in FIG. 13.

DETAILED DESCRIPTION OF THE INVENTION

FIG. 1 illustrates a resilient probe having an extensible spring. This probe is commercially available from AlphaTest Corporation and is sold under the tradename "Heliprobe." Probe 10 includes conductor 11 longitudinally movable within jacket 12. Free end 14 of conductor 11 extends past the end of jacket 12 which is held in fixture 13. The proximal end of conductor 11 is wound back over end 16 of jacket 12, forming helical spring 17. The end of spring 17 is attached to jacket 12 by clip 18.

In use, end 14 is pressed against a contact on a printed circuit board, causing conductor 11 to move longitudinally within jacket 12 and extend spring 17.

FIG. 2 illustrates another type of resilient probe, commercially available from Interconnect Devices, Inc. and other manufacturers. Probe 20 includes elongated barrel 21 having closed end 22 and open end 23. Spring 24 is contained within barrel 21, resting against closed end 22. Plunger 25 rests on spring 24 and extends past open end 23. Portion 29 of plunger 25 fits closely within barrel 21 to provide a sliding electrical contact between the plunger and the barrel. Reduced diameter portion 28 of plunger 25 reduces friction between the plunger and barrel 21 and provides clearance for detent 26 in the barrel. Plunger tail 27 is trapped behind detent 26 to prevent plunger 25 from falling out of barrel 21. Plunger head or tip 31 is shown as having a concave or socket shape, which is only one of the many shapes used for probe tips. When tip 31 is pressed onto a contact area, plunger 25 is pushed into barrel 21, compressing spring 24 against closed end 22.

Barrel 21 can be mounted directly in a fixture in an array with other probes or can be mounted in a conductive tube or receptacle which is mounted in a fixture in an array with other probes. Receptacle 31 has an inside diameter slightly greater than the outside diameter of barrel 21 and holds the barrel by means of crimp or detent 32. Interference ring or press ring 34 is a slightly enlarged diameter for frictionally engaging a fixture to hold receptacle 31 securely in place.

FIG. 3 illustrates a fixture for holding a plurality of probes in an array having the same pattern as the contact pattern on a printed circuit board or a hybrid circuit. Fixture 30 includes spaced apart retaining plates 35–39, each retaining plate having a plurality of aligned holes for receiving resilient probes 41–43. Plates 37–39 form a sandwich. Shear plate 39 is moveable from side to side, thereby applying a shear force to probes 41–43 and holding the probes in place. Retaining plates 35, 36, and 37–39 are separated by suitable spacers, such as spacers 51 and 52, and are held together by screws 54 and 55 which pass through the retaining plates and spacers, attaching them to frame 56. Tips 46–48 of probes 41–43 are approximately coplanar and any difference in height is compensated by the resiliency of the probes.

In FIG. 4, integrated circuits 61–63 are mounted on printed circuit board 64, forming a pattern of contact areas. Resilient pins 41–43, and several others, are held in array in a pattern corresponding to the pattern of the contact areas, such as areas 65 and 66. In order to test the circuit, pins 41–43 are lowered over the contact areas by suitable alignment apparatus (not shown) and make electrical contact with the integrated circuits. Any irregularity in the height of the areas, e.g. solder thickness, is compensated by the resiliency of the probes.

FIG. 5 illustrates a probe constructed in accordance with a preferred embodiment of the invention. Probe 70 includes tubular spring 71 concentric with plunger 72. The wall of tubular spring 71 includes helical cut 73 extending for several complete turns about the middle portion of spring 71. In a preferred embodiment of the invention, the spacing of the turns, denoted by reference numeral 74, is 1.1–5 times the width of the cut, denoted by reference numeral 75.

As a specific example of a spring made in accordance with the invention, a quartz tube having an outside diameter of six mils had a cut one mil wide forming coils having a spacing of three mils. The quartz tube was cut on a lathe having screw thread capability using a diamond saw such as is used in the semiconductor industry for cutting a wafer into die. The number of turns cut into the tube is determined by the amount of travel of the plunger and the material from which the tube is made. For a quartz tube having an outside diameter of six mils, thirty turns have been used, permitting a longitudinal displacement of fifteen mils by plunger 72.

Spring 71 preferably includes press ring 77 for attaching the distal end of the spring to barrel 76. Barrel 76 has a suitable socket or groove on the inside diameter thereof for receiving press ring 77. The proximal end of spring 71 is attached to plunger 72 by crimp 78. Any suitable means for mechanical connecting plunger 72 to spring 71 can be used, e.g. a crimp, solder, or adhesive. Since the proximal end of spring 71 is attached to plunger 72, pressing probe 70 to a contact causes spring 71 to extend. The extension of spring 71 can cause the inside diameter of spring 71 to be reduced. If this reduction takes place, spring 71 simply constricts about plunger 72 and cannot bind. The distal end of spring 71 preferably includes flare 79 to prevent the end of spring 71 from gouging plunger 72 if plunger 72 is moved laterally while being pressed against a contact area.

Electrical contact is made to the proximal end of plunger 72. Since electrical contact is made directly to plunger 72, spring 71 can be any suitable resilient material, whether or not electrical conductive. Spring 71 is preferably made from quartz or beryllium copper and can be made from other metals or from plastic, depending upon the particular application. A variety of materials are known in the art for making the plunger and barrel. For example, plunger 72 can be tungsten, beryllium copper or stainless steel and barrel 76 can be copper or brass.

FIG. 6 illustrates coaxial probe 90 constructed in accordance with the invention. The plunger of probe 90 includes center conductor 91 surrounded by dielectric sheath 92. The coaxial outer conductor of the plunger is layer 93. Layer 93 is an adherent layer of a suitable conductor, preferably chrome-platinum but other metals are suitable, such as aluminum, copper, or gold alloy. A layer of pure gold would not be used because gold is too soft and would abrade as the plunger moves within the probe. An alloy of copper and gold or copper, gold, and beryllium can be used.

The end of the plunger is inserted through spring 95 and extends past distal end 96 of spring 95. The proximal end of spring 95 is attached to layer 93 by any suitable means such as solder glass or adhesive, as shown at reference numerals 98 and 99. Spring 95 is preferably a quartz tube having multi-turn, helical cut 101 made in the central portion thereof. The number of turns is not critical and depends upon the properties of the tube from which the spring is made. Surrounding spring 95 is barrel 105 which is attached to spring 95 near distal end 96 by pressure rings 108 and 109 in spring 95. The pressure rings form an interference fit with barrel 105 and hold the spring securely.

Spring 95 stretches as center conductor 91 is pressed against a contact on a printed circuit board. Since layer 93 surrounds center conductor 91 along its entire length, the center conductor is fully shielded, greatly improving the high frequency capability of probe 90 and decreasing the chance that a stray signal will be coupled inadvertently to center conductor 91. Spring 95 is outside layer 93, the outer conductor of the coaxial plunger. Thus, electrical signals are not coupled through spring 95 and the spring can be made from insulating or conductive material. Even if made from electrically conductive material, spring 95 does not contribute any inductance to the probe.

FIG. 7 illustrates an alternative embodiment of the invention in which a resilient tip is added to the probe for connection to a ground terminal on a printed circuit board or hybrid substrate. Spring 120 is a tubular spring attached to outer layer 93, e.g. by solder 123. Spring 120 has points or prongs 125, 126 which extend slightly past the distal end of center conductor 91. The geometry of the lower end of spring 120 is determined by the particular application and can include one or more points or a ring concentric with center conductor 91. As probe 130 is brought into contact with a printed circuit board, spring 120 makes initial contact with a ground pad or contact area and spring 120 compresses slightly, permitting center conductor 91 to make contact with a signal terminal on the device under test. Spring 120 is compressed rather than extended. In this embodiment, layer 93 is grounded at each end thereof, preventing ground loops or other problems in testing a circuit.

FIG. 8 illustrates a double ended, resilient connector constructed in accordance with another aspect of the invention. In this embodiment, connector 140 includes spring 141 within barrel 143. Spring 141 is a tube having a multi-turn helical cut therein to provide resiliency along the length of the spring. End 144 of spring 141 is attached plunger 145 and end 146 of spring 141 is attached to plunger 147. The plungers extend past the ends of barrel 143 for making resilient contact in a suitable socket. In this embodiment, spring 141 is compressed rather than extended as connection is made. The amount of travel for plungers 145 and 147 is determined by the width of cut 149 and the number of turns.

FIGS. 9 and 9A illustrate a probe including two conductive pins within a single spring. In plunger 150, spring 151 includes two coiled sections, 153 and 154, separated by tubular section 155. Within spring 151 are conductive pins 158 and 159. Conductive pin 158 is attached to tubular section 155 by adhesive 161. Conductive pin 159 is attached to the upper end of spring 151 by adhesive 163. The lower end of spring 151 is the distal end of the probe and is attached to a barrel (not shown) as in the previous embodiment.

The operation of probe 150 is similar to the operation of the previous embodiment except that two, extremely closely spaced pads on a printed circuit board can be separately contacted by conductive pins 158 and 159. The minimum separation of the contact areas is determined essentially by the diameters of conductive pins 158 and 159 plus the thickness of insulator 164 (FIG. 9A). When conductive pin 158 touches a contact area, coiled section 154 stretches. When conductive pin 159 touches a contact area, coil section 153 stretches. As pin 158 moves slightly upward within spring 151, tubular section 155 raises the portion of spring 151 located above the section. This raises conductive pin 159 as much as conductive pin 158. It is therefore preferred that conductive pin 159 be slightly longer than conductive pin 158 to accommodate uneven contact areas. When conductive pin 159 contacts a pad on a printed circuit board, coil sections 153 and 154 stretch, raising conductive pin 158 approximately one-half the distance that conductive pin 159 is moved, assuming that coil sections 153 and 154 have the same resiliency. It is preferred that coil section 153 be more resilient than coil section 154, thereby reducing the amount that conductive pin 158 is raised.

If spring 151 is bisected at line 156 through section 155, one has two, collinear springs for separately controlling pins 158 and 159. The upper spring is spaced from the lower spring to permit the lower spring to stretch upward. Adhesive 161 is on the upper end of the lower spring and the lower end of the upper spring is attached to the barrel (not shown).

FIGS. 10 and 10A illustrate a single spring having three coil sections and enclosing three conductive pins. Spring 171 has coil sections 173 and 174 separated by tubular section 175 and coil section 176 separated from coil section 174 by tubular section 177. Within spring 171 are conductive pins 178, 179, and 180. Pin 178 is attached to section 177 by adhesive 182. Pin 179 is attached to section 175 by adhesive 181. Pin 180 (FIG. 10A) is attached to the upper portion of spring 171 by adhesive 185. The pins are separated by insulator 186.

In a probe, pins 178, 179, and 180 touch the pads on a printed circuit board with a force largely determined by section 176. If the contact areas are uneven, sections 173 and 174 adjust the heights of the conductive pins. In a preferred embodiment of the invention, section 174 has a greater resilience than section 176 and section 173 has a greater resilience than section 174. In an alternative embodiment, spring 171 can be cut at tubular sections 175 and 177 to produce three collinear springs for separately controlling pins 178, 179, and 180. The separate, collinear springs preferably have the same resiliency.

FIGS. 11, 11A, 11B illustrate an alterative embodiment of the invention in which a coaxial probe includes a probe tip having cantilever arms. Probe 190 is a coaxial probe constructed in the same manner as probe 130 (FIG. 7) except for the tip of the probe. In probe 190, the tip includes ground contact 191 attached to the distal end of dielectric sheath 92. Ground contact 191 includes ferrule 192 soldered to conductive layer 93. Attached to or integral with ferrule 192 are arms 194 and 195. Arms 194 and 195 extend radially outward and downward away from ferrule 192 and terminate in tips 196 and 197, respectively. Tips 196 and 197 extend below the lower end of conductive pin 91, assuring that tips 196 and 197 make contact prior to conductive pin 91. Arms 194 and 195 are resilient and are more resilient than spring 95, thereby assuring that conductive pin 91 makes contact.

FIGS. 12, 12A and 12B illustrate an alterative embodiment of the invention in which a tri-axial probe has a single plunger and three conductors. Probe 200 includes conductive pin 201, arm 202, and arm 203. Conductive pin 201 is surrounded by dielectric sheath 204 having conductive coating 205. Arm 202 is soldered to conductive coating 205. Surrounding dielectric sheath 204 is a second dielectric sheath 207, having conductive coating 208. Arm 203 is soldered to conductive coating 208. Surrounding dielectric sheath 207 is spring 210 which preferably comprises quartz and is made as described above. Spring 210 is contained within barrel 211 and is attached to barrel 211 by pressure ring 213. Probe 200 has three concentric conductors for signals from the tip of the probe to a tester. The concentric conductors exclude external signals and permit one to connect to a signal pad, a ground pad, a driven ground pad on a printed circuit board.

Tri-axial probe 200 is a somewhat complex structure which provides three conductive paths in an extremely short radius. In the embodiment of FIGS. 13 and 13A, probe 250 includes three conductors in a coaxial but simplified structure. Probe 250 is constructed in a manner similar to probes 190 (FIG. 11) and 130 (FIG. 7) except that the conductive layer does not completely surround the dielectric sheath.

In probe 250 conductive pin 251 is surrounded by dielectric sheath 253. Dielectric sheath 253 is inserted into spring 95 and is attached to spring 95 at the proximal end thereof. Dielectric sheath 253 (FIG. 13A) includes a conductive coating that has been partially removed from opposite sides of sheath 253, thereby producing a longitudinally split layer in which one portion is conductor 254 and the other portion is conductor 255. Arm 261 is attached to conductor 254 by solder 262. Arm 264 is attached to conductor 255 by solder 265. The lower ends of arms 261 and 264 are located slightly below the distal end of conductive pin 251. Arms 261 and 264 extend away from pin 251 and bend back as shown to narrow the radial spacing of the tips from pin 251. Having thus described the invention it will be apparent to those of skill in the art that various modifications can be made within the scope of the invention. For example, the probe shown in FIG. 1 can be improved by using a spring constructed in accordance with the invention. In the embodiment shown in FIG. 8, the travel of plunger 145 decreases the available travel for plunger 147. While a single spring is illustrated in FIG. 8, it is understood that more than one spring can be used. Specifically, concentric springs can be used, with one spring attached to plunger 145 and one spring attached to plunger 147. The springs are concentric but the helices are in opposite directions, i.e. one helix has a right hand orientation and the other helix has left hand orientation. This complementary orientation prevents the springs from interfering with one another and provides a bifilar winding of the springs. Instead of insulator 164 (FIG. 9A), each conductive pin can be coated with an insulating layer and a portion of the layer removed for soldering to the spring. Insulator 164 can be any suitable insulating material and preferably has a low coefficient of friction, such as Teflon® plastic.

In addition to its uses in electrical testing, the resilient probe described can be used for mechanical testing, e.g. dimensional analysis requiring a light touch of a plunger on a device under test located between the plunger and an anvil. Further, since a spring can be made from quartz, one can also utilize the spring as a piezo-electric strain gauge or as a piezo-electric transducer, e.g. applying a voltage to conductive coatings on the spring will cause it to elongate or compress.

I claim:

1. A resilient electrical connector comprising:

a barrel having a predetermined length;

an electrically conductive plunger located within and longitudinally movable within said barrel, said plunger having a length greater than said predetermined length and extending from said barrel to a tip;

a helical spring concentric with and located between said barrel and said plunger, said spring having a predetermined length between a first end connected to said barrel and a second end connected to said plunger;

wherein said spring is a tube having a helical cut along a predetermined portion of said length and wherein said first end of said spring is adjacent said tip, and said spring elongates when said tip makes contact.

2. The connector as set forth in claim 1 wherein said spring is metal.

3. The connector as set forth in claim 1 wherein said spring is glass.

4. The connector as set forth in claim 3 wherein said spring is quartz.

5. The connector as set forth in claim 1 wherein said spring is plastic.

6. The connector as set forth in claim 1 wherein said helical cut includes a number of turns and the spacing of said turns and the width of said cut are in a predetermined ratio.

7. The connector as set forth in claim 6 wherein said spacing is 1.1 to 5.0 times the width of said cut.

8. The connector as set forth in claim 1 and further comprising:

a second plunger located adjacent the first plunger within said spring.

9. The connector as set forth in claim 1 wherein said plunger is an electrically conductive pin.

10. The connector as set forth in claim 1 wherein said plunger includes an inner conductor, a dielectric sheath, and an outer conductor, said outer conductor being coaxial with said inner conductor and separated from said inner conductor by said dielectric sheath.

11. The connector as set forth in claim 10 wherein said outer conductor is a conductive coating on said dielectric sheath.

12. A resilient probe for making electrical contact with an electronic device, said probe comprising:

a tube having a predetermined length between a first end and a second end and a helical cut along a portion of said length;

a conductive plunger fitting within said tube and having a tip extending past said first end of said tube;

a barrel concentric with and surrounding said tube, said barrel having a first end
    (i) adjacent said first end of said tube and
    (ii) attached to said first end of said tube;

wherein said tube is attached to said plunger between said cut and said second end, whereby said tube elongates when said tip is pressed against said electronic device.

13. The probe as set forth in claim 12 wherein said plunger includes an inner conductor, a dielectric sheath, and an outer conductor, said outer conductor being coaxial with said inner conductor and separated from said inner conductor by said dielectric sheath.

14. The probe as set forth in claim 13 wherein said outer conductor is a conductive coating on said dielectric sheath.

15. The probe as set forth in claim 14 wherein said conductive coating is a split layer forming two conductors and said probe further includes a pair of conductive arms, attached to respective ones of said conductors.

16. The probe as set forth in claim 13 wherein said plunger also includes:

a second dielectric sheath and a conductive layer on said second dielectric sheath, said second dielectric sheath coaxial with and surrounding said outer conductor.

17. The probe as set forth in claim 13 wherein said dielectric sheath and said tube are each a quartz tube.

18. The probe as set forth in claim 12 and further comprising:

a second plunger fitting within said tube and having a tip extending past said first end of said tube.

19. The probe as set forth in claim 18 wherein said tube has a second helical cut along said length separated from the first helical cut by a tubular section and wherein said second plunger is attached to said tubular section.

20. The probe as set forth in claim 18 and further comprising:

a second tube having a predetermined length between a first end and a second end and having a helical cut along a portion of said length, said second tube collinear with the first tube and attached to said second plunger.

* * * * *